United States Patent
Fuller et al.

(10) Patent No.: US 7,282,441 B2
(45) Date of Patent: Oct. 16, 2007

(54) DE-FLUORINATION AFTER VIA ETCH TO PRESERVE PASSIVATION

(75) Inventors: Nicholas C. Fuller, Elmsford, NY (US); Timothy J. Dalton, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 10/904,432

(22) Filed: Nov. 10, 2004

(65) Prior Publication Data

US 2006/0099785 A1 May 11, 2006

(51) Int. Cl.
*H01L 21/4763* (2006.01)

(52) U.S. Cl. .................. 438/637; 438/624; 438/725; 257/E21.252; 257/E21.311; 257/E21.574

(58) Field of Classification Search ................ 438/624, 438/637, 725
See application file for complete search history.

(56) References Cited

U.S. PATENT DOCUMENTS

| | | | |
|---|---|---|---|
| 6,077,769 A | | 6/2000 | Huang et al. |
| 6,140,243 A | * | 10/2000 | Wallace et al. ............. 438/700 |
| 6,162,583 A | | 12/2000 | Yang et al. |
| 6,221,772 B1 | | 4/2001 | Yang et al. |
| 6,265,779 B1 | | 7/2001 | Grill et al. |
| 6,424,044 B1 | | 7/2002 | Han et al. |
| 6,534,415 B2 | | 3/2003 | Wang et al. |
| 2005/0079706 A1 | * | 4/2005 | Kumar et al. ................ 438/638 |
| 2005/0158999 A1 | * | 7/2005 | Lin et al. ..................... 438/687 |

\* cited by examiner

*Primary Examiner*—Alexander Ghyka
(74) *Attorney, Agent, or Firm*—Howard M. Cohn, Esq.; H. Daniel Schnurmann

(57) ABSTRACT

Novel interconnect structures possessing a dense OSG material for 90 nm and beyond BEOL technologies in which a low power density oxygen-based de-fluorination plasma process is utilized to increase NBLoK selectivity are presented. These BEOL interconnect structures are capable of delivering enhanced reliability and performance due to the reduced risk of Cu exposure and hence electromigration and stress migration related failures. The oxygen based de-fluorination process is such that the plasma conditions employed {low power density ($<0.3$ Wcm$^{-2}$); relatively high pressure ($>100$ mT); negligible ion current to wafer surface (applied source frequency only)} facilitate a physical expulsion of residual fluorine present on the chamber walls, wafer surface, and within the via structure; thus, minimizing the extent of NBLoK etching that can occur subsequent to removing polymeric byproducts of via etching.

12 Claims, 1 Drawing Sheet

DE-FLUORINATION AFTER VIA ETCH TO PRESERVE PASSIVATION

BACKGROUND OF THE INVENTION

The present invention relates to semiconductor device fabrication, more particularly to techniques for via level processing of organosilicate glass (OSG) based interlevel dielectric (ILD) materials and, more particularly, to techniques for removing polymer residue associated with via processing, particularly in a damascene process.

An integrated circuit (IC) device (also referred to as a semiconductor chip) can contain millions of transistors and other circuit elements that are fabricated on a single silicon crystal substrate (wafer). For the IC device to be functional, a complex network of signal paths will normally be routed to connect the circuit elements distributed on the surface of the device. Efficient routing of these signals across the device can become more difficult as the complexity and number of circuit elements are increased. Thus, the formation of multi-level or multi-layered interconnection schemes such as, for example, dual damascene wiring (interconnect) structures, have become more desirable due to their efficacy in providing high speed signal routing patterns between large numbers of transistors and other circuit elements on a complex IC.

Damascene Techniques

Generally, damascene techniques involve depositing an interlevel dielectric (ILD) layer, such as silicon dioxide ($SiO_2$; also referred to simply as "oxide"), forming an opening in the ILD, overfilling the opening with a metal such as copper (Cu), and removing excess metal using chemical mechanical polishing (CMP), resulting in a planarized interconnect structure. This results in a single "wiring level" or "interconnect level" of an overall "interconnect structure" having many wiring levels. The opening in the interconnect level may be a trench running essentially parallel to the surface of the integrated circuit (IC) chip, and a filled trench is referred to as a "wire" or a "line". A wire is used to route signals from a first location on the wafer to a second location remote from the first location. The trench for forming the wire may extend only partially (e.g., half-way) into the thickness of the ILD, from the top surface thereof.

Alternatively, an opening in the interconnect level may be a via, extending perpendicular to the surface of IC completely through the ILD for connecting an overlying wire of a higher wiring level or of the present wiring level (in dual damascene, described below) to an underlying wire of a lower wiring level. A filled via is typically simply referred to as a "via", and sometimes as a "plug" particularly when connecting to an underlying first metallization (M1) or to an element of an underlying MOS (metal oxide semiconductor) structure. Vias and wires are both referred to herein as "conductors", since their raison d'etre is conducting electrical signals.

In "dual" damascene techniques, the opening in the ILD comprises a lower contact or via hole portion in communication with an upper trench portion, and both the via and the trench portions are simultaneously filled. There are three main sequences (via-first, trench-first, buried-via) for forming dual-damascene differing in the sequence in which the via and trench are patterned and etched, but the resulting structure is generally the same for all three.

Presently, interconnect structures formed on an integrated circuit chip consist of at least about 2 to 8 wiring levels fabricated at a minimum lithographic feature size for the current generation of CMOS technology (currently approximately 180 nm (nanometers) designated about 1× (referred to as "thinwires") and above these levels are about 2 to 4 wiring levels fabricated at a width equal to about 2× and/or about 4× the minimum width of the thinwires (referred to as "fatwires"). A typical width for a via is about 140 nm, and it is common to have redundant vias effecting connections between overlying and underlying wires.

Copper (Cu) and Cu alloys have received considerable attention as a candidate for replacing aluminum (Al) and Al alloys in interconnect metallizations. Cu is relatively inexpensive, easy to process, and has a lower resistivity than Al. In addition, Cu has improved electrical properties vis-a-vis tungsten (W), making Cu a desirable metal for use as a conductive plug as well as conductive wiring. As used herein, "Cu" is intended to encompass high purity elemental copper as well as Cu-based alloys, such as Cu alloys containing minor amounts of tin, zinc, maganese, titanium, magnesium and germanium.

Due to Cu diffusion through interdielectric layer (ILD) materials, such as silicon dioxide, Cu interconnect structures should be encapsulated by a diffusion "barrier layer" (or "liner"). Conventional practices comprise forming a damascene opening in an ILD, and depositing a barrier layer such as TaN, lining the sidewalls and bottom of the opening in the ILD prior to depositing the Cu for the via or wire. Typical diffusion barrier layer metals include tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and a deilicon nitride for encapsulating Cu. The advantage of using such barrier layer materials to encapsulate Cu is not limited to the interface between Cu and the dielectric interlayer, but includes interfaces between the Cu and other metals as well.

The upper surface of any Cu conductor (typically a wire, since a via, by definition, will always be in contact with a bottom surface of an overlying conductor) must also be protected, such as against oxidation. To cap the upper surface of the copper interconnection, a "capping layer" (or "cap layer"), of a dielectric material such as silicon nitride ($Si_3N_4$; also simply referred to as "nitride", or SiN) is typically employed. The capping layer is also referred to as a "passivation layer", and is also sometimes referred to as a "barrier layer". Often the passivation layer must also function as an etch stop layer during subsequent processing, however materials which perform best as etch stop layers typically do not perform best as passivation layers. Silicon oxynitride, SiON, is usually preferred as a etch stop layer but is less desirable as a passivation layer because of delamination which can occur between copper and silicon oxynitride. Silicon nitride, SiN, avoids the delamination problem, and is a preferred passivation material, but is less desirable as an etch stop layer. Further, for Cu/low-k interconnect structures, SiN is essentially a high-k material (k~7.0). For this reason, various permutations of SiC such as SiCN or SiCNH are preferred (k~5.2) for the passivation layer for 90 nm and beyond BEOL (back end of line) technologies. (Low-k dielectric materials are discussed below.)

FIG. 1 illustrates a conventional BEOL (back end of line) interconnect structure 100 utilizing copper metallization, the barrier layers and the protective cap/passivation layers described above. The illustrated interconnect structure 100 comprises a first interconnect level 110 and a second interconnect level 130 and is shown (by way of example) as being formed on a substrate 102 such as a semiconductor wafer comprising a plurality of logic circuit elements such as transistors. A single "generic" contact area 104 is illustrated in the substrate 102 and is, for example, an electrode formed on a source or drain region of a MOSFET (metal oxide semiconductor, field effect transistor).

It should clearly be understood that FIG. 1 illustrates but an extremely small (microscopic) portion of an integrated circuit (IC) device, let alone a semiconductor wafer comprising a very large number of such devices. For example, what is shown may have a width of only a few microns (μm) of a semiconductor wafer having a diameter of several inches. Also, in "real life" things are not so neat and clean, rectilinear and uniform as shown. However, for one of ordinary skill in the art to which the invention most nearly pertains, this and other figures presented in this patent application will be highly informative, when taken in context of the associated descriptive text.

The first interconnect level 110 comprises an interlevel dielectric layer (ILD) 112, such as oxide or low-k SiCOH type material which is deposited by a PECVD (plasma enhanced chemical vapor deposition) type process and having an exemplary thickness of approximately 490 nm (nanometers). A trench 114 is formed extending into the ILD 112 from the top (as viewed) surface thereof, such as by a plasma etching type process and having a depth of approximately 275 nm. A via 116 is then formed such as by a plasma etching type process and extending from a selected location at the bottom (as viewed) of the trench 114 to the bottom surface of the ILD 112 (in this case, to the electrode 104 on the underlying substrate 102). The trench 114 and via 116 comprise an "opening" in the ILD 112. A barrier layer 118, such as TaN, is deposited such as by physical vapor deposition (PVD) or chemical vapor deposition (CVD) so that it lines the sidewalls and bottom of the opening in the ILD 112. A typical thickness for the barrier layer 118 is 20 nm and metal for the barrier layer will also deposit on the top surface of the ILD 112. Copper (Cu) 120 is then deposited into the lined opening, and will overfill the opening. Next, chemical mechanical polishing (CMP) is performed to remove excess barrier material and copper from the surface of the ILD 112, leaving a planarized top surface for subsequent semiconductor fabrication processes to be performed. The copper 120 forms a wire (or line) in the trench 114 and a plug (or via) in the via 116. The copper conductor is embedded in the surface of the ILD 112, but because the top surface of the wire is exposed, a capping (or "cap", or "passivation") layer 122 such as nitride or SiC is deposited, such as by PECVD (plasma enhanced CVD) on the surface of the wire, and has an exemplary thickness of 35 nm.

The second interconnect level 130 is formed atop (overlying) the first interconnect level 110 and is essentially identical to the first interconnect level 110. Both levels 110 and 130 are shown as being formed by a dual damascene process. The second interconnect level 130 comprises an interlevel dielectric layer (ILD) 112, such as oxide. A trench 114 is formed in the ILD 132. A via 136 is then formed, extending to the bottom surface of the ILD 132. The trench 134 and via 136 comprise the "opening" in the ILD 132. In this case, the via 136 is aligned with the opening 124 in the cap layer 122 of the first interconnect level 110 so that metal filling the via 136 of the second interconnect level 130 can make electrical contact with metal filling the trench 114 of the underlying, first interconnect level 110. The via 136 is typically etched, photoresist, photolithography, and using a fluorine-based chemistry, stopping on the underlying passivation layer 122.

A barrier layer 138, such as TaN, is deposited so that it lines the sidewalls and bottom of the opening in the ILD 132, and is processed as described hereinabove. Copper (Cu) 140 is deposited into the lined opening, and is processed as described hereinabove. The copper 140 forms a wire (or line) in the trench 134 and a plug (or via) in the via 136. A capping layer 142 such as nitride is deposited on the surface of the wire. Where necessary, the capping layer 142 is patterned to have an opening (not shown) to allowing a via of a subsequent (higher) wiring level to make contact with the wire in the trench 134.

The dual damascene interconnect structure 100 shown in FIG. 1 is fabricated utilizing conventional damascene processing steps well known to those skilled in the art. Since such techniques are well known and are not critical for understanding the present invention, a detailed discussion of the same is not given herein. It will be understood that various steps and materials have been omitted, for illustrative clarity, such as seed layers, adhesion layers, and the like.

Dielectric layers 112 and 132 may be the same or different insulative inorganic or organic material. Suitable dielectrics include, but are not limited to: $SiO_2$, fluorinated $SiO_2$, $Si_3N_4$, polyimides, diamond, diamond-like carbon, silicon polymers, paralyene polymers, fluorinated diamond-like carbon and other like dielectric compounds.

Low-k Dielectric Materials

Semiconductor devices are typically joined together to form useful circuits using interconnect structures comprising conductive materials (e.g., metal lines) such as copper (Cu) or aluminum (Al) and dielectric materials such as silicon dioxide ($SiO_2$). The speed of these interconnect structures can be roughly assumed to be inversely proportional to the product of the line resistance (R), and the capacitance (C) between lines. Line resistance can be reduced (hence, speed increased) by using copper (Cu) instead of aluminum (Al). To further reduce the delay and increase the speed, it is desirable to reduce the capacitance (C). One way in which this can be done by reducing the dielectric constant "k", of the dielectric material in the interlevel dielectric layers (ILDs). Thus, there is considerable interest in developing "low-k" materials as well as deposition methods for them that are compatible with integrated circuit technology.

A common dielectric material for use in an interlevel dielectric layer (ILD) is silicon dioxide (SiO2, also referred to simply as "oxide"). Oxide has a dielectric constant k of at least 3.85, typically 4.1-4.3, or higher. Air has a dielectric constant k of approximately 1.0. By definition, a vacuum has a dielectric constant k of 1.0.

A variety of low-k dielectric materials are known, and are typically defined as materials having a dielectric constant k less than 3.85, or in other words, less than that of oxide. Sometimes, materials having k<2.5 are referred to as "ultralow-k". These low-k and ultralow-k dielectric materials can generally be characterized by their composition and/or by the way in which they typically are deposited.

Deposition is a process whereby a film of either electrically insulating (dielectric) or electrically conductive material is deposited on the surface of a semiconductor wafer. Chemical Vapor Deposition (CVD) is used to deposit both dielectric and conductive films via a chemical reaction that occurs between various gases in a reaction chamber. Plasma enhanced Chemical Vapor Deposition (PECVD) uses an inductively coupled plasma to generate different ionic and atomic species during the deposition process. PECVD typically results in a low temperature deposition compared to the corresponding thermal CVD process. Spin-on deposition is used to deposit materials such as photoresist, and can also be used to deposit dielectric materials. A wafer is coated with material in liquid form, then spun at speeds up to 6000 rpm, during which the liquid is uniformly distributed on the surface by centrifugal forces, followed by a low temperature bake which solidifies the material.

Examples of spin-on low-k materials include:

BCB (divinylsiloxane bisbenzocyclobutene), sold by Dow Chemical.

SiLK™, an organic polymer with k=2.65, similar to BCB, sold by Dow Chemical.

NANOGLASS™, an inorganic porous polymer with k=2.2, sold by Honeywell.

FLARE 2.0™ dielectric, an organic low-k poly(arylene) ether available from Allied Signal, Advanced Microelectronic Materials, Sunnyvale, Calif.

Inorganic materials such as spin-on glass (SOG), fluorinated silicon glass (FSG) and, particularly, methyl-doped porous silica which is referred to by practitioners of the art as black diamond, or BD.

Organo-silicate materials, such as JSR LKD 5109 (a spin-on material, Japan Synthetic Rubber).

Organic polymers (fluorinated or non-fluorinated), inorganic polymers (nonporous), inorganic-organic hybrids, or porous materials (xerogels or aerogels).

Materials in the parylene family of polymers, the polynapthalene family of polymers, or polytetrafluoroethylene.

Examples of low-k Chemical Vapor Deposition (CVD) and Plasma Enhanced CVD (PECVD) low-k materials include:

Black Diamond™, a organosilicon glass (OSG) which is a Si—O—C—H type of material, with a dielectric constant k of 2.7 to 3.0 (e.g., 2.9), sold by Applied Materials Inc.

CORAL™, also an organosilicon glass (OSG) which is a Si—O—C—H type of material, with k of 2.7-3.0, sold by Novellus Systems, Inc.

fluorinated $SiO_2$ glass, and amorphous C:F.

It is also known that pores in dielectric materials can lower the dielectric constant. Low-k dielectric materials can typically be deposited ab initio either with or without pores, depending on process conditions. Since air has a near 1 dielectric constant, porous films exhibit reduced dielectric constants than the base material in which they are developed. (If the dielectric is not "porous", it is referred to as being "dense"). Generally, it is the spin-on materials (e.g., SiLK, NANOGLASS) materials that exhibit a high degree of porosity. The PECVD materials generally do not exhibit such high degree of porosity, due to the method of deposition. As a result, it is very difficult to prepare a CVD film with a k value <2.5. For low-k dielectric materials having pores, it is important that an additional layer or film overlies the porous dielectric layer to act as a moisture barrier for the porous dielectric layer.

In one class of interconnect structures, the thinwires are formed in a low dielectric constant (k) organosilicate (e.g., SiCOH) inter-level dielectric (ILD) layer, and the fatwires are made in a silicon dioxide ILD having a dielectric constant of about 4. (Class here refers to the type of low-k material, namely OSG films, as opposed to polymeric films such as SiLK, FLARE and so on.)

One of the many challenges associated with the fabrication of the said thinwires and fatwires for 90 nm and beyond CMOS BEOL technologies is the issue of ash induced consumption of passivation layer material during via level damascene processing.

As mentioned above (ref FIG. 1), the via 136 in the second interconnect level 130 is etched, stopping on the capping layer 122 of the previous interconnect level 110 using normal etching procedures. For oxide based dielectrics, this involves the use of fluorine-based chemistry, which results in fluorine-based polymer byproducts being deposited on the sidewalls of the via, the surface of the wafer and the walls of the reaction chamber. Then, during ashing to remove photoresist (PR) for forming the via 136, the capping layer 122 under the via 136 is compromised because there is fluorine byproduct from polymers formed during etching.

During via level etching of the OSG ILD material, specific fluorine-based chemistries ($C_4F_8$ and/or $C_4F_6$) are employed to acquire sufficient selectivity to the carbon containing capping layer (SiCH/BLoK or SiCNH/NBLok for example). This, so-called, over etch processing step is typically run for a specified time period to compensate for film and plasma non-uniformities in addition to wafer-to-wafer and chamber-to-chamber variability. In this manner, overetch processes typically have as much as 20% to 30% overetch built into the processing step to ensure minimal contact resistance between via and underlying trench layer.

As will become evident from the descriptions that follow, the present invention is most applicable to any dielectric material, such as OSG low-k ILDs, both dense and porous, the etching of which requires fluorine-based chemistries. On the other hand, organic type ILDs are not etched w/fluorine but rather with any oxidizing or reducing chemistry.

Low-k dielectric films, called BLOk™ (SiC, may have some H, so SiCH) and N-BLoK (SiCNH), have been developed for use in copper damascene processes. These silicon carbide films are deposited using trimethylsilane ((CH3) 3SiH) and have a lower dielectric constant (k<5) than that of conventional SiC films (k>7) generated by $SiH_4$ and $CH_4$, and that of plasma silicon nitride (k>7). Characterisation of the film, including physical, electrical, and copper diffusion properties, and etch selectivity, shows that this film is a good cap layer/etch stop for low-k copper damascene applications. Its low dielectric constant enables a significant reduction in the effective k value of the completed dielectric stack in damascene devices.

The use of SiCOH-based materials for 90 nm technology presents many etching challenges: one such challenge occurs during Via-level damascene processing; namely achieving minimal NBLoK (passivation layer) loss post processing. The majority of this passivation layer loss can actually occur during ashing as residual chamber and wafer fluorine is "liberated" during ashing leading to etching of the passivation which if negligible can lead to potential Cu oxidation and consequent reliability issues.

In semiconductor manufacturing, plasma ashing is the process of removing the photoresist from an etched wafer. Using a plasma source, a monatomic reactive specie is generated. Oxygen or fluorine are the most common reactive specie. The reactive specie combines with the photoresist to form ash which is removed with a vacuum pump.

U.S. Pat. No. 6,221,772 discloses a method of in-situ cleaning polymers from holes on a semiconductor wafer and in-situ removing the silicon nitride layer. The semiconductor wafer comprises a substrate, a silicon nitride ($Si_3N_4$) layer on the substrate, a silicon oxide ($SiO_2$) layer on the silicon nitride layer, and a photo-resist layer on the silicon oxide layer. The silicon oxide layer and the photo-resist layer have a hole extending down to the silicon nitride layer. The hole contains polymer left after etching of the silicon oxide layer. The method comprises performing a in-situ plasma ashing process by injecting oxygen ($O_2$) and argon (Ar) to completely remove the photo-resist layer and the polymer remaining within the hole. Subsequently, the silicon nitride layer was removed in the same chamber. The flow rate of $O_2$ is maintained between 50~2000 sccm (standard cubic centimeter per minute) and the flow rate of Ar is maintained between 50~500 sccm.

U.S. Pat. No. 6,534,415 discloses a method of removing polymer residues after tungsten etch back. A plasma ashing step is performed after a brush cleaning step to eliminate polymer residues that remain on the metal barrier layer after tungsten etch back. Another tungsten etch back process is further performed to remove a tungsten oxide film that is formed by reacting the tungsten layer with an $O_2$ gas used in the plasma ashing step.

BRIEF DESCRIPTION (SUMMARY) OF THE INVENTION

It is a general object of the invention to provide an improved technique for via level damascene processing to remove chamber wall, wafer surface and via structure fluorine-based polymeric material.

It is a further object of the invention to provide an improved BEOL interconnect structure of, e.g., the dual damascene type, more particularly, to provide a BEOL interconnect structure in which there is improved passivation layer retention and consequent selectivity, as well as improved reliability and functionality.

It is therefore an object of the present invention to provide a BEOL interconnect structure of, e.g., the dual damascene type, in which an optimized oxygen-based de-fluorination process {low power density (<0.3 $Wcm^{-2}$); relatively high pressure (>100 mT); negligible ion current to wafer surface (applied source frequency power only)} is utilized during via level damascene processing to remove chamber wall, wafer surface and via structure fluorine-based polymeric material.

In keeping with these and other objects of the present invention, there is provided an interconnect structure built in a dense OSG low-k dielectric film in which a low power density/high pressure oxygen-based plasma process is utilized to enable increased passivation layer retention (selectivity) during via level damascene processing and, thus, improve device/BEOL interconnect reliability and functionality.

As mentioned above, during the etching of the via (136), a relatively thick (typically >10 nm) layer of polymeric material is usually formed which ought to be removed without perturbing the underlying passivation (e.g., NBLoK; SiCNH) layer (122). This polymeric layer is normally removed during the subsequent oxygen-based ashing step (oxygen based chemistries are preferred for ashing dense OSG-based materials versus nitrogen and/or hydrogen-based chemistries because of the reduced ILD modification effect of the former compared with the latter) but may also induce etching of the underlying NBLoK film by the following mechanism. Since the chamber walls and wafer surface (in addition to the via structures) are well laden with fluorine-based polymer accrued during the via etch processing steps; the ash process can serve to liberate chamber wall and wafer fluorine such that subsequent to the removal of the atop polymeric layer within the via, the "freed" fluorine coupled with oxygen from the ashing process can etch the underlying NBLoK film reducing the overall via process selectivity. In any case, it is desirable that the passivation (e.g., NBLoK; SiCNH) layer (122) not be compromised, that a non-trivial (>10 nm) amount of NBLoK (SiCNH) capping layer remaining after trench (or via) etch because if the copper is exposed as you build the trench (or via), one can sputter Cu onto the sidewalls (SWs) of the trench (via) and this can affect barrier liner (e.g., TaN) integrity/conformality as well as have potential reliability issues (electromigration for example).

According to the invention, generally, a high pressure and low power density oxygen containing ($O_2$, CO, $CO_2$ or combinations thereof) based plasma is used for "flushing" residual chamber and wafer fluorine and so minimizing NBLoK (capping layer) loss during the subsequent ashing process. These conditions ensure that there is sufficient efficiency in flushing chamber and wafer fluorine while minimizing actual NBLoK loss owing to minimal gas dissociation conditions (high pressure, low power density). This entails high pressure gas conditions (e.g., 150 mTorr) and minimal power density settings (<200 W source frequency power only). Increased efficiency in retaining barrier NBLoK can be achieved by increasing the $CO:O2$ gas ratio.

For dense SiCOH materials, the preferred chemistry for inflicting minimal dielectric modification is oxygen based. However, the preferred chemistry for porous SiCOH based materials is nitrogen $N_2$ and/or hydrogen $H_2$ containing chemistries as these chemistries inflict less damage to porous SiCOH dielectrics versus oxygen based chemistries. Hence, the preferred chemistry for de-fluorinating porous SiCOH based builds are nitrogen and/or hydrogen containing chemistries.

According to the invention, an interconnect structure interconnect structure on a wafer comprises at least a first interconnect level and a second interconnect level formed atop the first wiring level; the first interconnect level comprising a first interlevel dielectric layer (ILD), and a first conductor embedded in a first opening of the first ILD; the second interconnect level comprising a second interlevel dielectric layer (ILD), and a second opening extending to the first conductor; a passivation layer on the surface of the first ILD, covering the first conductor; wherein the second opening is formed using photoresist, photolithography, and fluorine-based etching, stopping on the passivation layer; and a method of forming the interconnect structure comprises after etching the second opening, and before removing residual photoresist, subjecting the wafer to a de-fluorination process comprising low power density, relatively high pressure and negligible ion current to wafer surface. The second ILD comprises any dielectric material, both dense and porous, the etching of which requires fluorine-based chemistries, for example a dense OSG low-k dielectric material. The passivation layer typically comprises silicon carbide (SiC) type material. The interconnect structure is typically a dual-damascene type interconnect structure.

According to an aspect of the invention, the low power density is typically less than 0.3 $Wcm^{-2}$; and the relatively high pressure is greater than 100 mTorr, such as 150 mTorr. For dense low-k dielectrics, the de-fluorination process is performed using an oxygen-based plasma comprising oxygen ($O_2$) and at least one gas selected from the group consisting of, CO, $CO_2$. For porous low-k dielectrics, the de-fluorination process is performed with a plasma comprising at least one of nitrogen ($N_2$) and hydrogen ($H_2$).

According to an aspect of the invention, the de-fluorination process is performed in a plasma chamber, the plasma chamber being capable of producing radio frequency (RF) power at a source frequency and a bias frequency; and in the de-fluorination process, using substantially only source frequency power, and negligible bias frequency power. For example, the source frequency power is less than 200 watts; and the negligible bias frequency power is no more than 50 watts. In this manner, minimal ion energy is directed at the wafer surface, thereby protecting the passivation layer while removing residual polymers.

According to the invention, a method of forming an opening through an interlevel dielectric (ILD) overlying to an underlying passivation layer comprises patterning photoresist over the ILD; and using a selected chemistry and a first process, creating the opening through the ILD wherein the etching of the opening results in byproducts deposited in the opening and on the ILD; after etching the opening, performing a second process to remove the photoresist; wherein the process of removing photoresist would liberate byproducts which would attack the underlying passivation layer; characterized by before removing the photoresist, removing the byproducts by performing a byproduct removal process comprising low power density, relatively high pressure and negligible ion current to wafer surface. For example, the passivation layer comprises silicon carbide (SiC); the ILD comprises a dense OSG low-k dielectric film, the chemistry for etching the opening in the ILD comprises fluorine the first process for creating the opening in the ILD comprises etching, the byproducts comprise fluorine-based polymeric material, and the second process for removing the photoresist is plasma ashing.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
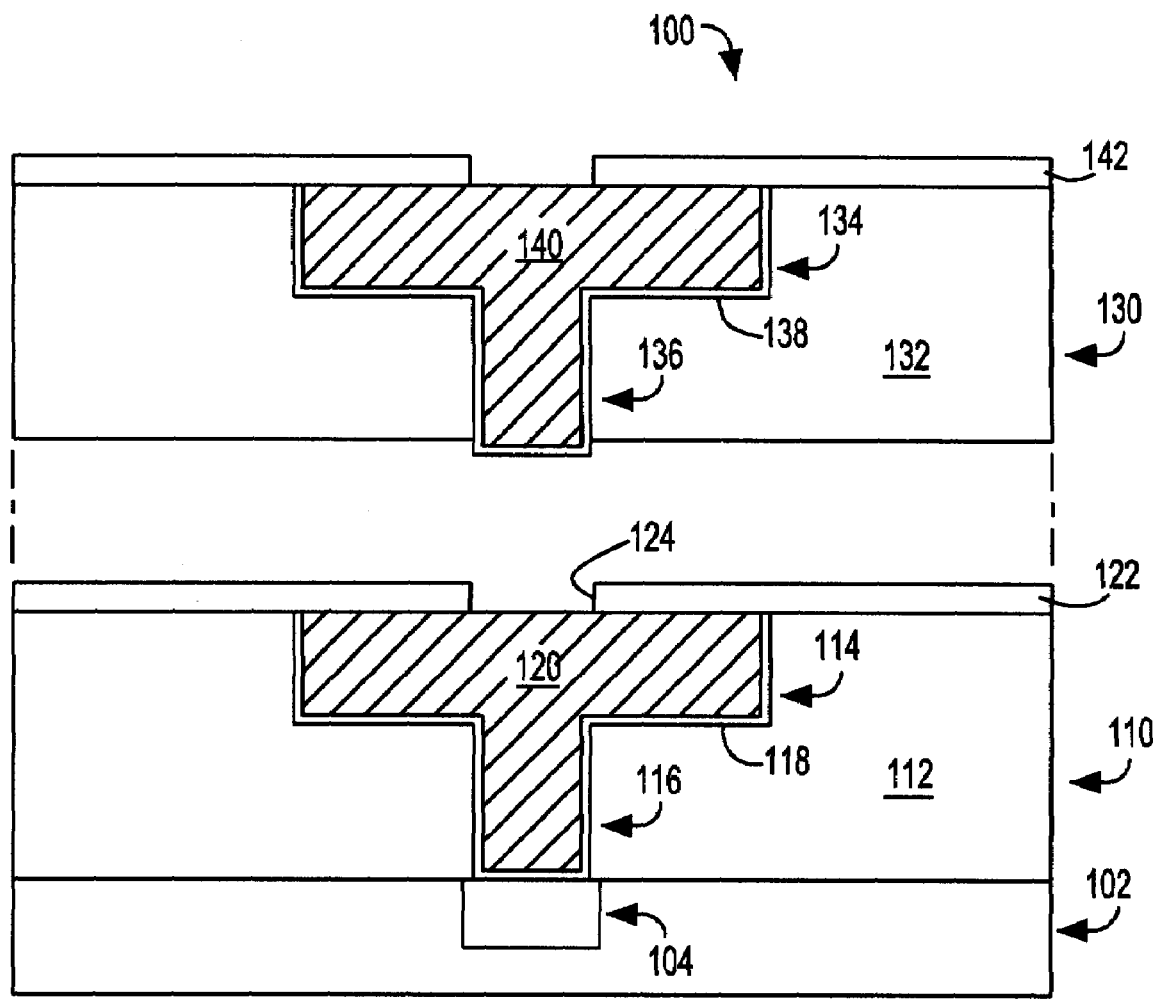

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGS.) of the drawing, in which case typically the last two significant digits may be the same, the most significant digit being the number of the drawing figure (FIG.).

FIG. 1 is an exploded cross-sectional view of an interconnect structure having multiple interconnect (wiring) levels, according to the prior art.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They may be included to provide a sense of proportion. Generally speaking, it is the relationship between various elements, where they are located, their contrasting compositions, and sometimes their relative sizes that is of significance.

The present invention is directed to an interconnect structure useful for forming a semiconductor device. The interconnect structure is fabricated in a dense OSG material. After via formation (see 136, FIG. 1), an optimized oxygen-based de-fluorination process {low power density (<0.3 $Wcm^{-2}$); relatively high pressure (>100 mT); negligible ion current to wafer surface (source frequency only)} is used to ensure that there is sufficient carbon containing passivation layer (SiCH/BLoK or SiCNH/NBLok for example) retention/selectivity (at least 10-15 nm of NBLoK passivation layer retained post via level etch processing) and, thus, facilitating increased and sufficient interconnect and device reliability.

This de-fluorination process enables sufficient NBLoK (e.g.) retention by eliminating residual fluorine on the chamber walls, wafer surface, and via structure primarily by a physical mechanism. This facilitates increased retention of the underlying NBLoK film by a two-fold process: since the de-fluorination process is strictly speaking physical, subsequent to removing the atop polymeric film in the via, the underling NBLoK layer remains intact and secondly, since residual fluorine has been completely flushed at the commencement of the ash processing step; any additional etching of the NBLoK layer is impeded.

The problem of etching underlying NBLoK can be alleviated through the use of a low power density oxygen-based ($O_2$, $CO$, $CO_2$, or combinations thereof) de-fluorination process performed prior to the ash processing step. The de-fluorination process conditions comprise:

low power density (<0.3 $Wcm^{-2}$);

relatively high pressure (>100 mT); and negligible ion current to wafer surface (applied source frequency only), and ensuring that the utilized plasma is relatively undissociated with minimal ion current impacting the wafer surface and as such, the dominant mechanism responsible for the removal of chamber/wafer fluorine is a physical one.

These conditions are significant as they retard NBLoK etching subsequent to removing the polymeric layer within the via structure, thus preserving the passivation layer selectivity of the process. It is further significant to note that for dense OSG materials utilized for the 90 nm and 65 nm technology nodes, the use of oxygen-based de-fluorination processes for improved NBLoK retention (selectivity) is necessary as alternative potential de-fluorination gases ($N_2$, $H_2$, $NH_3$ or combinations thereof), while capable of successfully removing the polymeric film within the via structure, will inflict more modification to the dense OSG film than oxygen-based de-fluorination processes and as such would be less suitable for fabricating an interconnect structure in these films that delivers target RC values.

Plasma chambers produce RF (radio frequency) power at two frequencies, a source frequency and a bias frequency.

The source frequency breaks up the gas, produces free radicals and free ions, and is typically 27 MHz (megahertz) and above. The bias frequency is typically 13.5 MHz or less, and provides energy to ions in the plasma to strike the wafer surface.

According to an aspect of the invention, by using substantial source frequency power only, and negligible bias frequency power—for example, no more than 50 watts of bias frequency power-minimal ion energy is directed at the wafer surface, thereby protecting the NBLoK layer.

According to the invention, generally, there is provided an interconnect structure built in a dense OSG low-k dielectric film in which a low power density/high pressure oxygen-based plasma process is utilized to enable increased passivation layer retention (selectivity) during via level damascene processing and, thus, improve device/BEOL interconnect reliability and functionality.

The aforementioned U.S. Pat. Nos. 6,534,415 and 6,221,772 use a high power oxygen-based plasma to remove residue remaining after a W or an Oxide etch process, respectively. These conditions likely promote residue/plasma chemical interaction forming volatile adsorbates that are removed, which reduces electrical interference during metallization. In the present invention, removal of residual fluorine is achieved by a primarily flushing (physical) mechanism performed under low power density conditions that facilitate increased passivation layer retention (selectivity). If high power conditions (which promote increased gas dissociation and hence apt conditions for chemical assisted etching) were employed for the de-fluorination process of interest here (i.e., similar to those used for patents U.S. Pat. Nos. 6,534,415 and 6,221,772) the passivation layer retention would be undesirably decreased.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Method of forming an interconnect structure on a wafer having at least a first interconnect level and a second interconnect level formed atop the first wiring level;

the first interconnect level comprising a first interlevel dielectric layer (ILD), and a first conductor embedded in a first opening of the first ILD;

the second interconnect level comprising a second interlevel dielectric layer (ILD), and a second opening extending to the first conductor;

a passivation layer on the surface of the first ILD, covering the first conductor;

wherein the second opening is formed using photoresist, photolithography, and fluorine-based etching, stopping on the passivation layer;

the method comprising:

after etching the second opening, and before removing residual photoresist, subjecting the wafer to a de-fluorination process comprising low power density, relatively high pressure and negligible ion current to wafer surface;

performing the de-fluorination process using an oxygen-based plasma comprising oxygen ($O_2$) and at least one gas selected from the group consisting of CO and $CO_2$;

performing the de-fluorination process in a plasma chamber, the plasma chamber being capable of producing radio frequency (RF) power at a source frequency and a bias frequency; and in the de-fluorination process, using substantially only source frequency, and negligible bias frequency.

2. The method of claim 1, wherein:

the low power density is less than 0.3 $Wcm^{-2}$; and the relatively high pressure is greater than 100 mTorr.

3. The method of claim 2, wherein the relatively high pressure is approximately 150 mTorr.

4. The method of claim 1, further comprising performing the de-fluorination process using a plasma comprising at least one of nitrogen ($N_2$) and hydrogen ($H_2$).

5. The method of claim 1, wherein:

the source frequency power is less than 200 watts; and the negligible bias frequency power is no more than 50 watts.

6. The method of claim 1, wherein minimal ion energy is directed at the wafer surface, thereby protecting the passivation layer while removing residual polymers.

7. The method of claim 1, wherein the second ILD comprises a dense OSG low-k dielectric material.

8. The method of claim 1, wherein the second ILD comprises any dielectric material, both dense and porous, the etching of which requires fluorine-based chemistries.

9. The method of claim 1, wherein the residual photoresist is removed by plasma ashing.

10. The method of claim 1, wherein the second opening is formed by etching, with as much as 20-30% overetch built into the processing step to ensure minimal contact resistance between a second conductor in the second opening and the underlying first conductor.

11. The method of claim 1, wherein the interconnect structure is a dual-damascene type interconnect structure.

12. The method of claim 1, wherein the passivation layer comprises silicon carbide (SiC) type material.

* * * * *